United States Patent
Fukui et al.

[11] Patent Number: 5,740,091
[45] Date of Patent: Apr. 14, 1998

[54] IIR TYPE DIGITAL FILTER

[75] Inventors: Takao Fukui; Kazutoshi Nomoto, both of Kanagawa, Japan

[73] Assignee: Sony Corporation

[21] Appl. No.: 571,651

[22] Filed: Dec. 13, 1995

[30] Foreign Application Priority Data

Dec. 15, 1994 [JP] Japan .................. 6-333449

[51] Int. Cl.$^6$ .................................................. G06F 17/10
[52] U.S. Cl. .................................................. 364/724.17
[58] Field of Search ..................................... 364/724.17

[56] References Cited

U.S. PATENT DOCUMENTS

| | | | |
|---|---|---|---|
| 4,920,507 | 4/1990 | Takeda | 364/724.17 |
| 5,189,634 | 2/1993 | Eberle et al. | 364/724.17 |

FOREIGN PATENT DOCUMENTS

| | | |
|---|---|---|
| 0195482 | 9/1986 | European Pat. Off. |
| 0196825 | 10/1986 | European Pat. Off. |
| 1461477 | 1/1977 | United Kingdom |

*Primary Examiner*—David H. Malzahn
*Attorney, Agent, or Firm*—Jay H. Maioli

[57] ABSTRACT

In addition to an output Y(n) of an adding device, a dither output of a dither generating circuit is supplied to an adding device. The output Y(n) of the adding device is added to a bit that is one bit lower than the LSB of the shortest word length of the hardware (namely, the place of LSB/2). The output of the adding device is supplied to a delay device. In other words, when the shorter word length is 32 bits corresponding to the word length of the RAM of the delay device, the dither is added to the bit 33. In the data Y(n) to which the dither has been added, the low order bits thereof are truncated corresponding to the word length of the delay device. The resultant data is supplied as next timing output data Y'(n−1) to the delay device and stored therein.

2 Claims, 7 Drawing Sheets

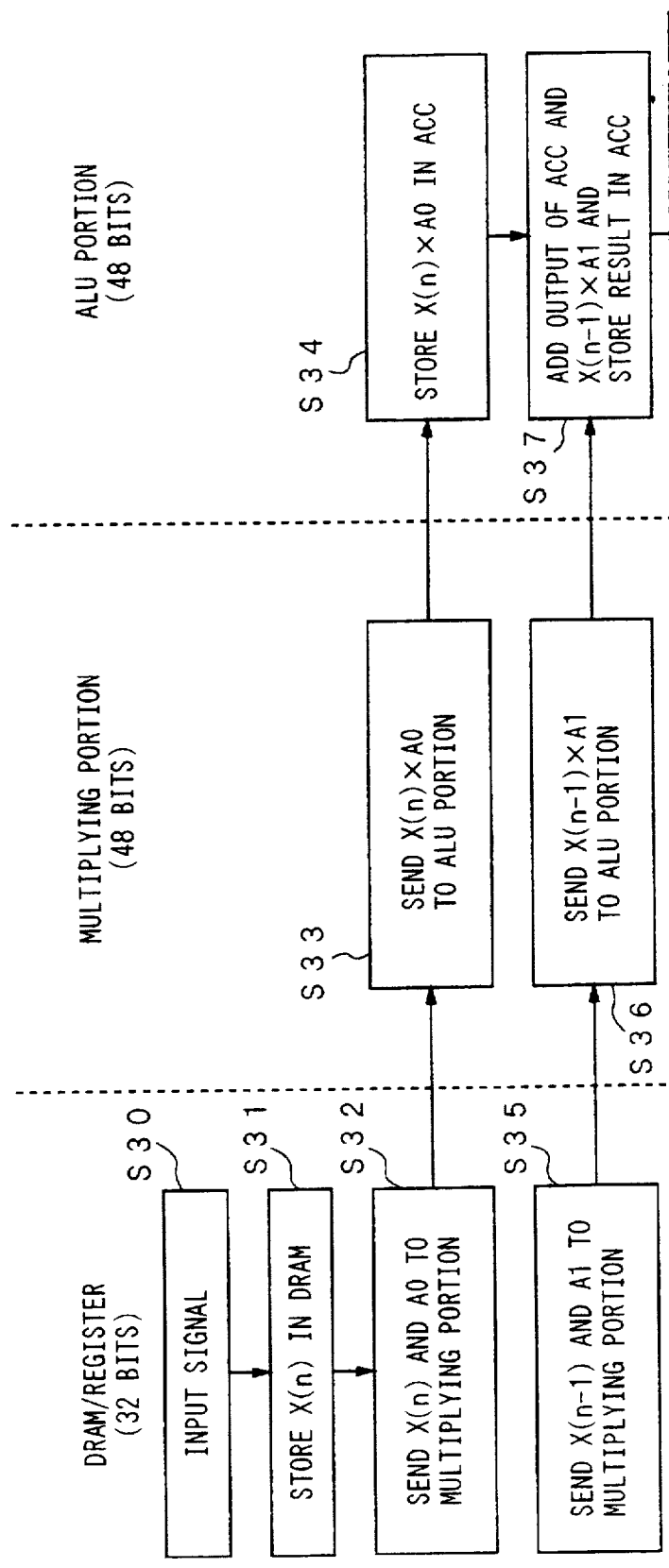

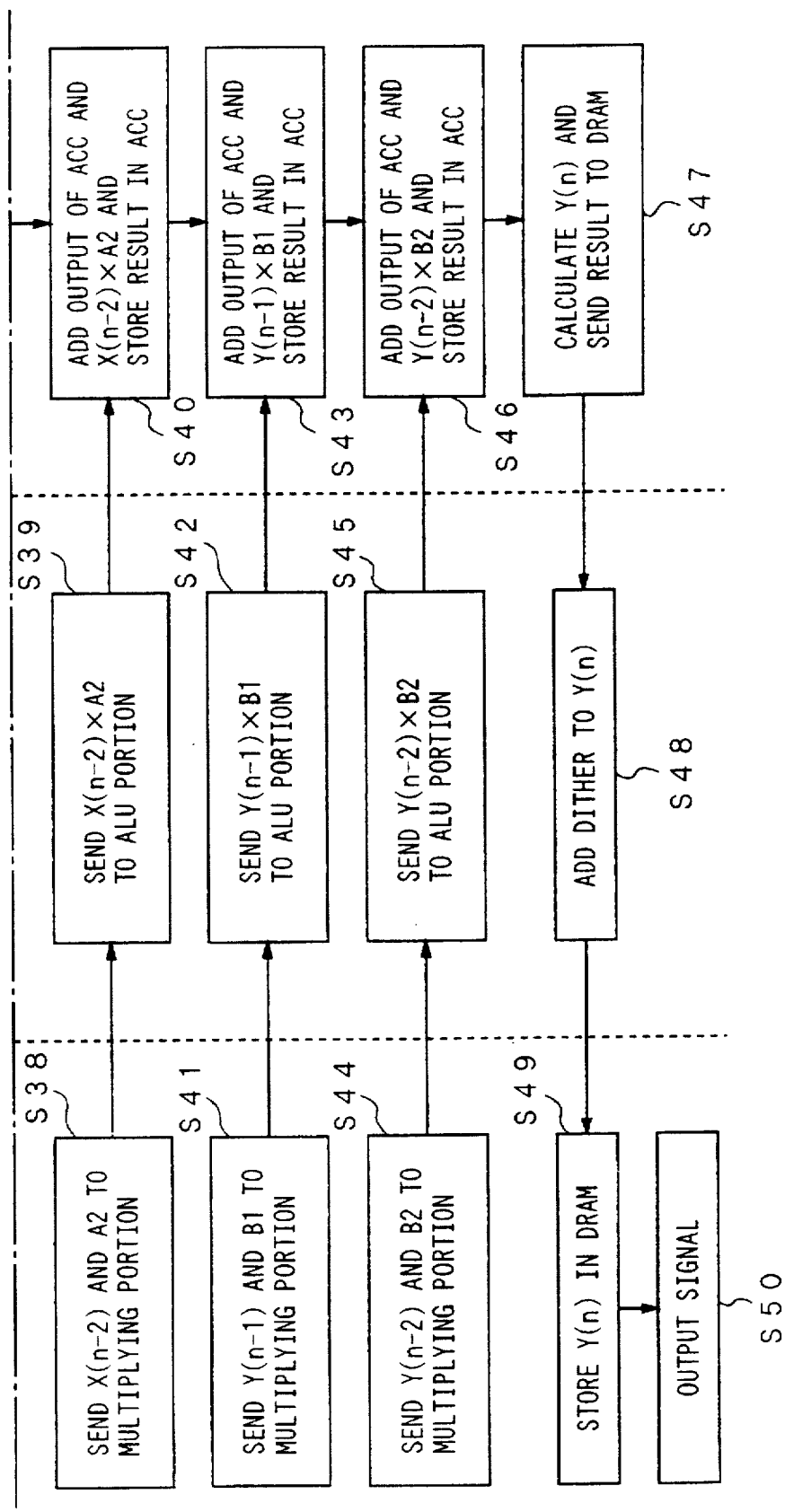

5,740,091

IIR TYPE DIGITAL FILTER

BACKGROUND OF THE INVENTION

1. Field of the Invention

The present invention relates to an IIR type digital filter.

2. Description of the Related Art

Conventional digital filters can be categorized as IIR type and FIR type. The FIR type has a better characteristic than the IIR type. Thus, for components that require a high sound quality such as the over-sampling filter of a CD player as an audio unit, the FIR type is used. However, the FIR type filter has a large delay as many as 500 to 2000 samples (0.01 to 0.04 s in the case where the sampling frequency is 48 kHz). Thus, the FIR type filter is hardly used for professional units in which a delay time adversely affects their sound and performance qualities. Consequently, conventional professional units mainly use the IIR type filters. The difference in character between these two filters is also described in Japanese Patent Laid-Open Publication No. 58-80911, for example.

Next, in addition to the structure of the conventional IIR type filter and the operation thereof, an occurrence of a DC limit cycle that is a drawback of the IIR type filter will be described. FIG. 4 shows the structure of a conventional secondary IIR type digital filter.

In this circuit, an input terminal 20 is connected to delaying circuits 21 and 22 as the next stage circuits. The delaying circuits 21 and 22 are connected to multiplying devices 23, 24, and 25 as the next stage circuits. Outputs of the multiplying devices 23, 24, and 25 are connected to an adding device 26. In addition, outputs of the multiplying devices 27 and 28 are connected to the adding device 26. Inputs of the multiplying devices 27 and 28 are connected to an output of the adding device 26 through delaying circuits 29 and 30. Thus, a feedback circuit is constructed. The output of the adding device 26 is also connected to an output terminal 31.

Input data $X(n)$ that is received from input terminal 20 is supplied to the multiplying device 23. The multiplying device 23 multiplies the input data $X(n)$ by a coefficient $A_0$. Input data $X(n-1)$ that is one sample earlier than the input data $X(n)$ and that is delayed by the delaying circuit 21 is supplied to the multiplying device 24. The multiplying device 24 multiplies the input data $X(n-1)$ by a coefficient $A_1$. Likewise, input data $X(n-2)$ that is two samples earlier than the input data $X(n)$ and that is delayed by the delaying circuit 22 is supplied to the multiplying device 25. The multiplying device 25 multiplies the input data $X(n-2)$ by a coefficient $A_2$. The outputs of the multipliers 23, 24, and 25 are supplied to the adding device 26. The adding device 26 adds the outputs of the multiplying devices 23, 24, and 25.

Output data $Y(n-1)$ that is one sample earlier than output data $Y(n)$ and that is delayed by the delaying circuit 30 is supplied to the multiplying device 27. The multiplying device 27 multiplies the output data $Y(n-1)$ by a coefficient $B_1$. Output data $Y(n-2)$ that is two samples earlier than the output data $Y(n)$ and that is delayed by the delaying circuit 29 is supplied to the multiplying device 28. The multiplying device 28 multiplies the output data $Y(n-2)$ by a coefficient $B_2$. The outputs of the multiplying devices 27 and 28 are supplied to the adding device 26. The adding device 26 adds the outputs of the multiplying devices 27 and 28 to the added result of the outputs of the multiplying devices 23, 24, and 25. The output of the adding device 26 is supplied as the final output data $Y(n)$ to the output terminal 31.

In the above-described structure, the output data $Y(n)$ that is supplied to the output terminal 31 is calculated as follows.

$$Y(n)=A_0 \times X(n)+A_1 \times X(n-1)+A_2 \times X(n-2)+B_1 \times Y(n-1)+B_2 \times Y(n-2) \quad (1)$$

Next, the case where the above-described process is accomplished by real hardware (such as RAMs, registers, an ALU, a multiplying device, a CPU that controls these parts) will be described. FIGS. 5A and 5B are flow charts showing the above-described process. FIG. 6 is a block diagram showing the circuit construction corresponding to the flow charts shown in FIGS. 5A and 5B. It will be described below with reference to FIGS. 5A, 5B and 6.

Step S30 is a step for inputting a signal. At step S30, a signal is input from the input terminal 10. It is assumed that the word length of the input data is 32 bits. At step S31, the input signal is stored as $X(n)$ to a DRAM 12 through a bus 11. In this example, it is assumed that the word length of the DRAM 12 is 32 bits. At the next step S32, the input data $X(n)$ stored in the DRAM 12 is sent to a register 15 of a multiplying portion 14. A KRAM 13 has stored a coefficient $A_0$. The coefficient $A_0$ is sent to a register 16 of the multiplying portion 14. In this example, it is assumed that the word length of the KRAM 13 is 16 bits.

At step S33, a multiplying device 17 receives the input data $X(n)$ and the coefficient $A_0$ from the registers 15 and 16 and multiplies $X(n) \times A_0$. The result is sent to a register 18 of the multiplying portion 14. In this case, since the word length of $X(n)$ is 32 bits and the word length of the coefficient $A_0$ is 16 bits, the word length of the data of the calculated result is around 48 bits. The data sent to the register 18 is sent to an ALU portion 19. The ALU portion 19 adds the output of the register 18 and 32-bit data that is output from a register 20. At step S34, the added result is stored in the register 20 of the ALU portion 19. In this case, the word length of the register 20 is 52 bits due to a carry or the like.

The DRAM 12 stores sample data $X(n-1)$ that is one sample earlier than $X(n)$. The KRAM 13 stores the coefficient $A_1$. At step S35, the sample data $X(n-1)$ is sent to the register 15 of the multiplying portion 14. The coefficient $A_1$ is sent to the register 16 of the multiplying portion 14. At step S36, the multiplying device 17 receives the sample data $X(n-1)$ and the coefficient $A_1$ from the registers 15 and 16 and multiplies $X(n-1) \times A_1$. The result is sent to the register 18 of the multiplying portion 14. The output of the register 18 is sent to the ALU portion 19. The ALU portion 19 adds the output data of the register 18 and the 32-bit output data of the register 20. At step S37, the added result and the data stored in the register 20 at step S34 are added and stored in the register 20 of the ALU portion.

The DRAM 12 stores sample data $X(n-2)$ that is two samples earlier than $X(n)$. The KRAM 13 stores the coefficient $A_2$. At step S38, the sample data $X(n-2)$ is sent to the register 15 of the multiplying portion 14. The coefficient $A_2$ is sent to the register 16 of the multiplying portion 14. At step S39, the multiplying device 17 receives the sample data $X(n-2)$ and the coefficient $A_2$ from the registers 15 and 16 and multiplies $X(n-2) \times A_2$. The result is sent to the register 18 of the multiplying portion 14. The output of the register 18 is sent to the ALU portion 19. The ALU portion 19 adds the output data of the register 18 and the 32-bit output data of the register 20. At step S40, the added result and the data stored in the register 20 at step S37 are added and stored in the register 20 of the ALU portion.

The DRAM 12 stores output data $Y(n-1)$ that is one sample earlier than $Y(n)$. The KRAM 13 stores the coefficient $B_1$. At step S41, the output data $Y(n-1)$ is sent to the register 15 of the multiplying portion 14. The coefficient $B_1$ is sent to the register 16 of the multiplying portion 14. At step S42, the multiplying device 17 receives the output data $Y(n-1)$ and the coefficient $B_1$ from the registers 15 and 16 and multiplies $Y(n-1) \times B_1$. The result is sent to the register 18 of the multiplying portion 14. The output of the register 18 is sent to the ALU portion 19. The ALU portion 19 adds the output data of the register 18 and the 32-bit output data of the register 20. At step S43, the added result and the data stored in the register 20 at step S40 are added and stored in the register 20 of the ALU portion.

The DRAM 12 stores output data $Y(n-2)$ that is two samples earlier than $Y(n)$. The KRAM 13 stores the coefficient $B_2$. At step S44, the output data $Y(n-1)$ is sent to the register 15 of the multiplying portion 14. The coefficient $B_2$ is sent to the register 16 of the multiplying portion 14. At step S45, the multiplying device 17 receives the output data $Y(n-2)$ and the coefficient $B_1$ from the registers 15 and 16 and multiplies $Y(n-1) \times B_2$. The result is sent to the register 18 of the multiplying portion 14. The output of the register 18 is sent to the ALU portion 19. The ALU portion 19 adds the output data of the register 18 and the 32-bit output data of the register 20. At step S46, the added result and the data stored in the register 20 at step S43 are added and stored in the register 20 of the ALU portion.

At step S47, the output data $Y(n)$ is obtained from the result of step S46 corresponding to the formula (1). The high order four bits of the output data $Y(n)$ are truncated. Thus, the word length of the output data $Y(n)$ is changed from 52 bits to 48 bits. The resultant 48-bit data $Y(n)$ is sent to the selector 22. The selector 22 truncates the low order 16 bits from the data $Y(n)$. At step S48, the resultant 32-bit data $Y(n)$ is sent to the DRAM 12 through the bus 11. In addition, at step S49, the 32-bit data $Y(n)$ is sent to the output terminal 23 through the bus 11.

In other words, the selector 22 truncates the 48-bit data into the 32-bit data that accords with the word length of the DRAM 12.

In the above-described process, when the calculation word length of the signal process is satisfactorily large and the data $Y(n)$ is obtained corresponding to the formula (1), a DC limit cycle does not take place. For example, in the case where the filter is used in an audio unit, when the calculation word length is 48 bits, it is enough. However, in a real circuit, the calculation word length is restricted by hardware and so forth. For example, in the above-described example, the word length of the DRAM 12 and the register 15 is 32 bits. It is difficult to increase the word length of the DRAM 12 and the register 15.

Thus, as described above, when data having a large word length is sent from the multiplying portion 14 and the ALU portion 19 to the DRAM 12 and the register 15 which have a small word length, the data is truncated. In the flow chart shown in FIGS. 5A and 5B, the data truncation is performed at steps S47 and S48. In this example, 48-bit data is truncated to high order 32-bit data.

In the IIR type filter, output data at earlier timings is used and thereby data is circulated. Thus, when 48-bit data is truncated to high order 32-bit data, a truncation error takes place. The truncation error becomes a truncation noise and accumulates in the circuit. When the truncation noise has a correlation in the time sequence, as data is circulated, the magnitude of the truncation noise proportionally increases. Thus, a DC limit cycle takes place. The DC limit cycle results in a DC offset, thereby deteriorating the SN ratio of the data.

OBJECTS AND SUMMARY OF THE INVENTION

Thus, an object of the present invention is to provide an IIR type digital filter that suppresses the occurrence of a DC limit cycle and prevents the SN ratio from being deteriorated.

The purpose, structure, and effect of the present invention will become clear with the explanation that follows. Here, a related art reference that is relatively similar to the structure of the present invention will be described in brief. For example, Japanese Patent Laid-Open Publication No. 5-145376 discloses a digital filter for adding a dither signal to the results of the multiplications performed in a FIR filter that repeatedly performs multiplications and additions of coefficients for an input digital signal. An object of the related art reference is to remove the correlation with signal components from noise removed by an accumulator at a sacrifice of the S/N ratio and thereby improve the sound quality. In this structure, although the insertion of the dither signal results in a decrease of the S/N ratio, when a predetermined number of bits are rounded and the word length is restricted in a quantizing process, the drop of the information of a weak signal can be minimized.

The technology of the above-described related art reference is also described in U.S. Pat. Nos. 4,920,507 and 5,073,777. Since the structures of these related art references are similar to the structure of the present invention, as will become clear with the explanation that follows, it should be noted that the object of the present invention is opposed to the objects of such related art references.

According to the present invention, there is provided an IIR type digital filter, comprising: an input terminal for receiving input data; a plurality of first delay devices connected in parallel with the input terminal; a first multiplication device connected to each connection node of the first delay devices; a first addition device for adding each output of the first multiplication device; an output terminal connected to an output of the first addition device; a second addition device connected to the output terminal; a plurality of second delay devices connected in parallel with an output of the second addition device; a second multiplication device connected to each connection node of the second delay devices; connecting means for connecting each output of the second multiplication device to the first addition device; and dither generating means connected to the second addition device.

According to the above-described structure, the DC limit cycle of the IIR type digital filter can be suppressed from taking place, thereby improving the SN ratio.

The above, and other, objects, features and advantage of the present invention will become readily apparent from the following detailed description thereof which is to be read in connection with the accompanying drawings.

BRIEF DESCRIPTION OF THE DRAWINGS

FIGS. 2A and 2B are flow charts showing an example of a process in the case that the present invention is accomplished by hardware;

DETAILED DESCRIPTION OF THE PREFERRED EMBODIMENTS

Next, with reference to the accompanying drawings, an embodiment of the present invention will be described. In the present invention, a dither is added to data when the data is sent from a multiplying portion and an ALU portion that have a large word length to a RAM and a register that have a small word length so as to remove the correlation of truncated signal components and thereby suppress an occurrence of a DC limit cycle.

The dither is added to a bit that is one bit after than the LSB of the shortest word length (the place of LSB/2). For example, in the case that the word length of the multiplying portion and the ALU portion is for example 48 bits and the word length of the data RAM and the register portion is for example 32 bits, when the 48-bit data is converted into the 32-bit data for the data RAM, a dither is added to bit 33 of the data to be sent to the data RAM. The low order bits after the bit of the dither are truncated and sent as 32-bit data.

Figure 1:
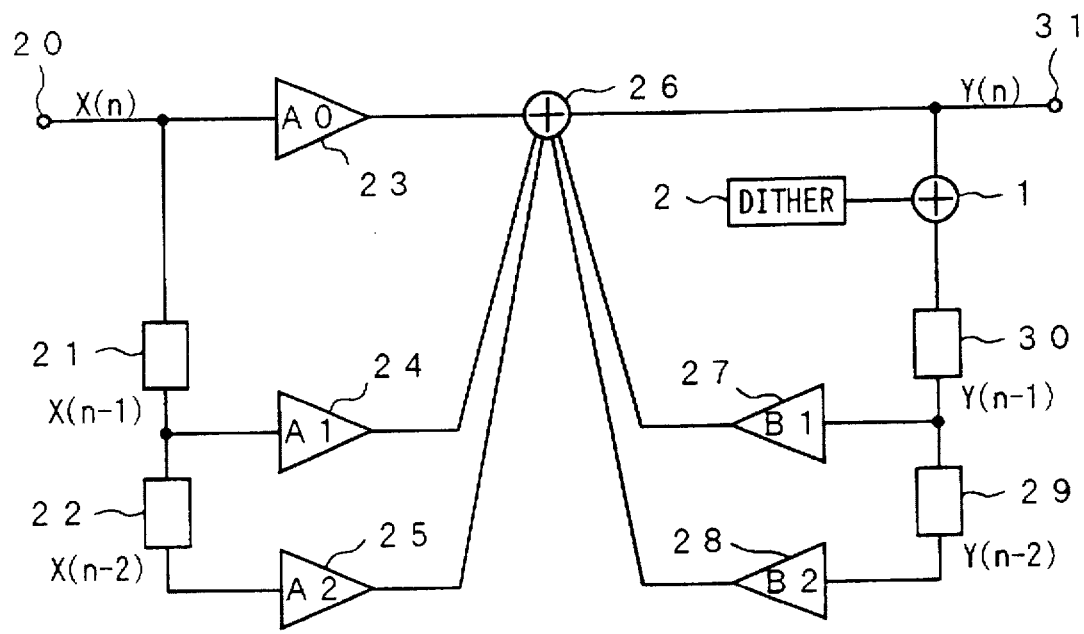
FIG. 1 is a block diagram showing the structure of an IIR type digital filter according to the present invention.
Figure 4:
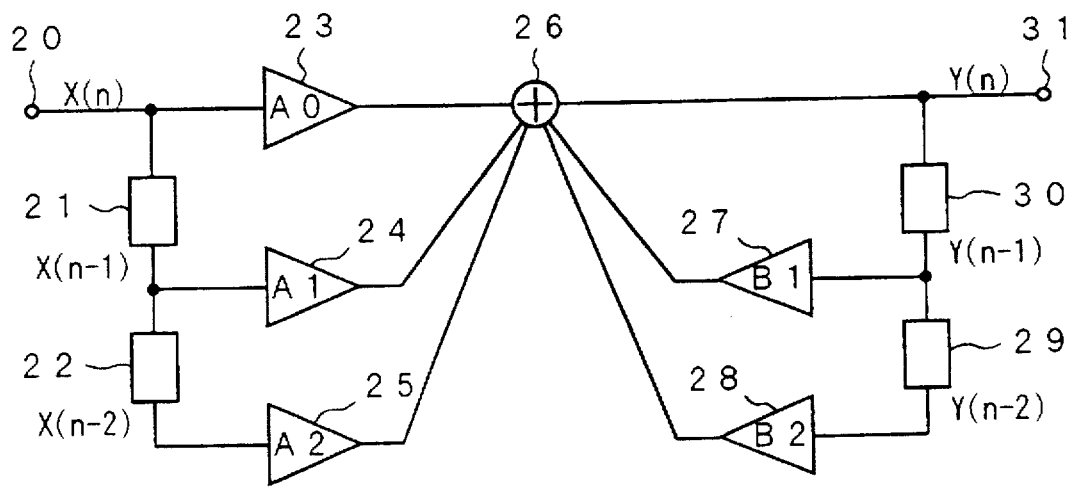
FIG. 4 is a block diagram showing the structure of an IIR type digital filter according to a related art reference.

FIG. 1 shows an example of the structure of an IIR type digital filter that accomplishes the above-described method. In this structure, the word length of the output of the adding device 26 is larger than the word length of the delaying circuits 29 and 30 in the structure of the conventional IIR type filter shown in FIG. 4. In this example, an adding device 1 is disposed at the beginning of a feedback circuit. The adding device 1 is connected to a dither generating circuit 2. In FIG. 1, similar portions to those shown in FIG. 4 are denoted by similar reference numerals and their description is omitted.

The output Y(n) of the adding device 26 is supplied to the adding device 1. In addition, a dither output of the dither generating circuit 2 is supplied to the adding device 1. The adding device 26 adds the dither to the output Y(n) of the adding device 26. As described above, the dither is added to the bit that is one bit after than the LSB of the shorter word length. When the shorter word length is 32 bits and is equal to the word length of the RAM used for the delaying circuit 30, the dither is added to the bit 33.

The data Y(n) to which the dither has been added is supplied as the next timing output data Y'(n−1) to the delaying circuit 30 and stored therein. At this point, the low order bits of the data Y(n) are truncated corresponding to the word length of the delaying circuit 30.

Since the dither is added to the data before the low order bits are truncated, the correlation of the signal being truncated is eliminated. In other word, the truncation noise due to the truncation of the low order bits of the data is randomized. Thus, when the signal is circulated, the noise hardly accumulates. Consequently, the occurrence of the DC limit cycle can be suppressed, thereby improving the SN ratio.

Figure 3:
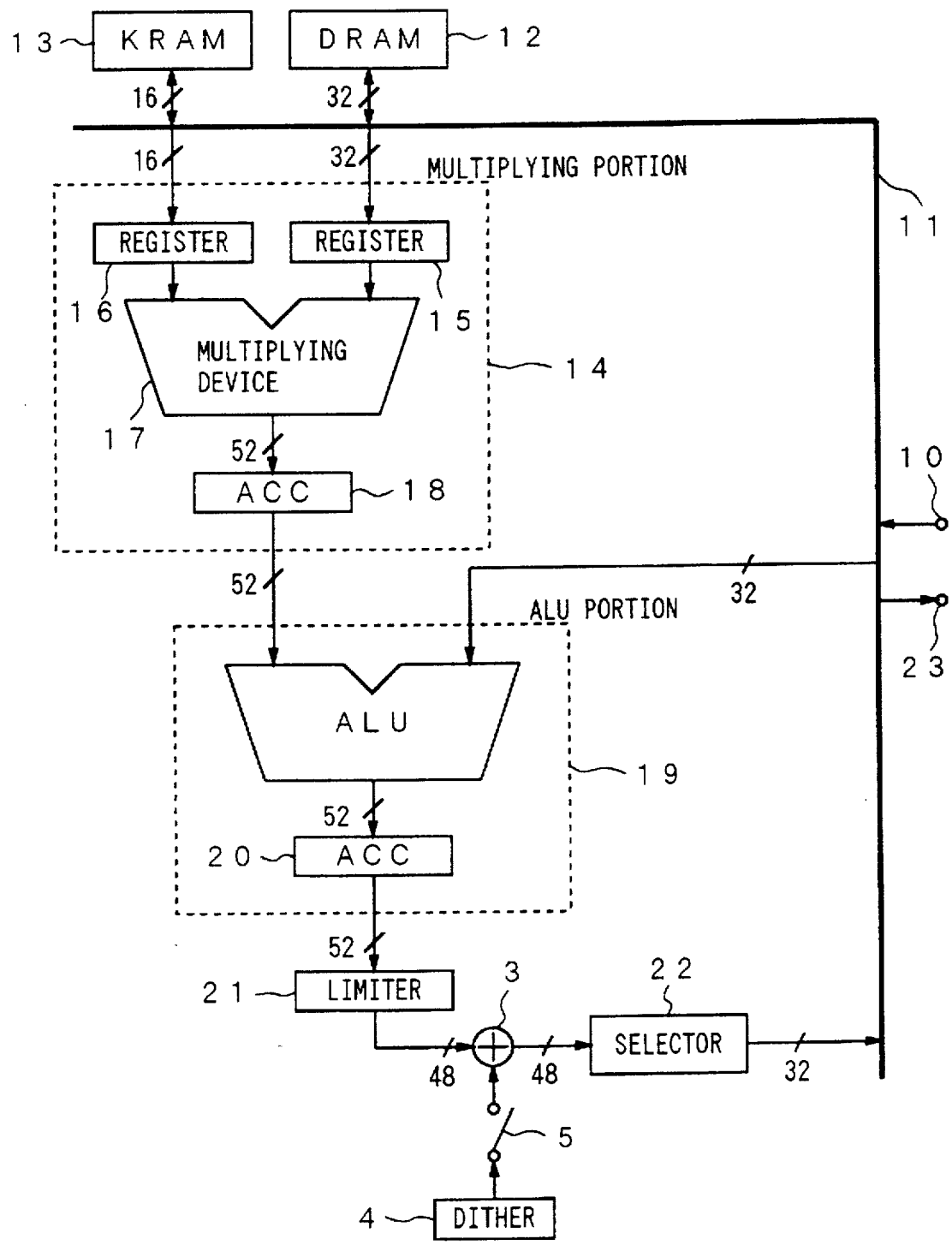
FIG. 3 is a block diagram showing an example of the circuit structure in the case that the present invention is accomplished by real hardware.

Next, the case that where the above-described process is performed by real hardware will be described. FIGS. 2A and 2B are flow charts showing the process performed by the hardware. FIG. 3 shows an example of the circuit structure corresponding to the flow charts shown in FIGS. 2A and 2B. In FIGS. 2A, 2B and 3, similar components to those of the related art reference shown in FIGS. 5A, 5B and 6 are denoted by similar reference numerals and their description is omitted.

Figure 5A:
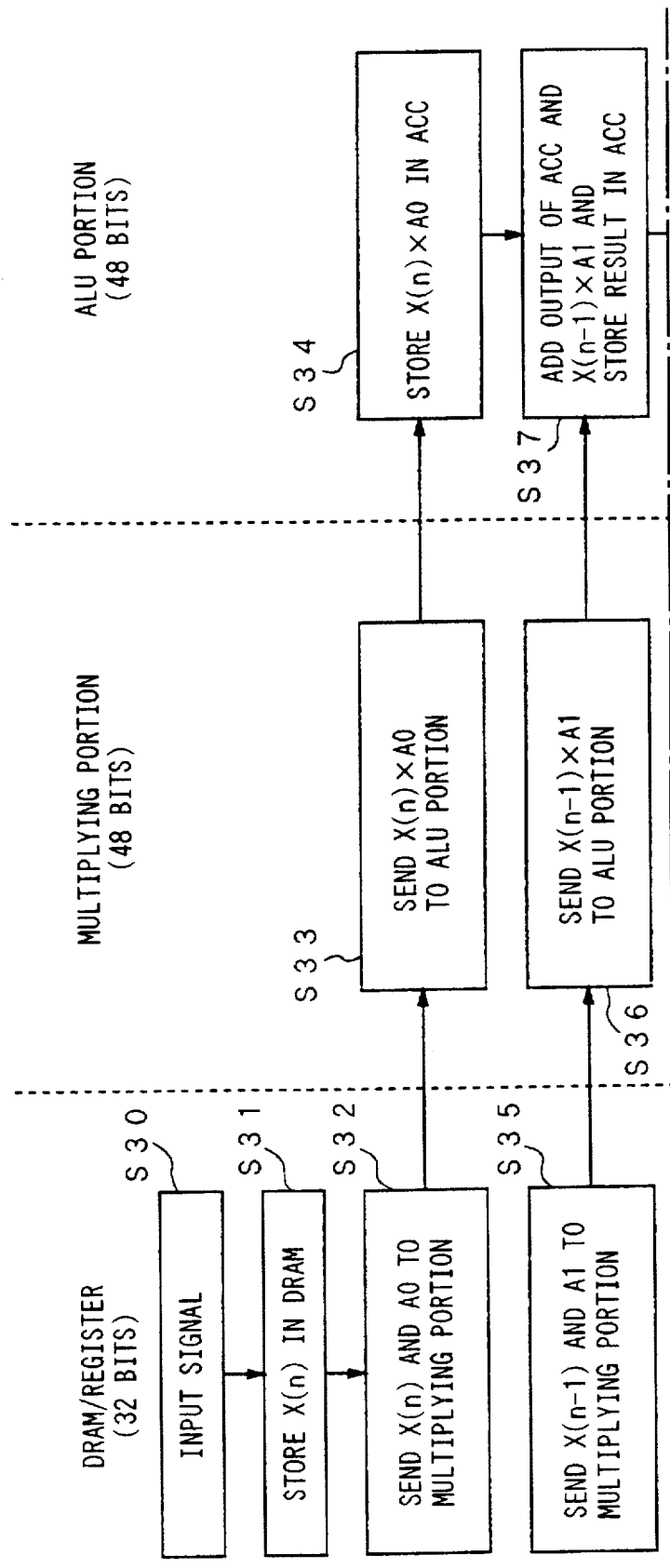
FIGS. 5A and 5B are flow charts showing an example of the process of the IIR type digital filter according to the related art reference accomplished by real hardware.
Figure 5B:
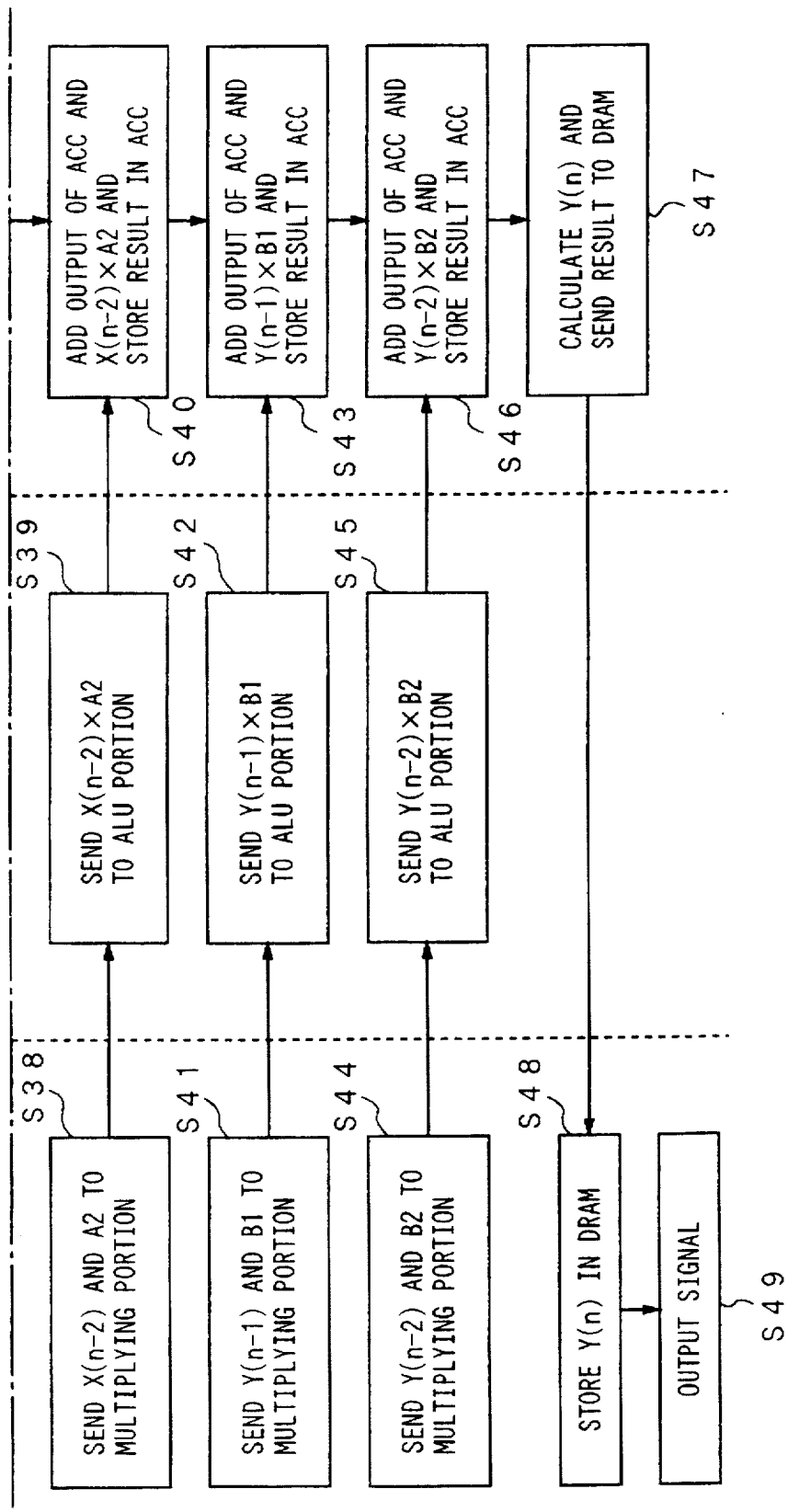
Figure 6:
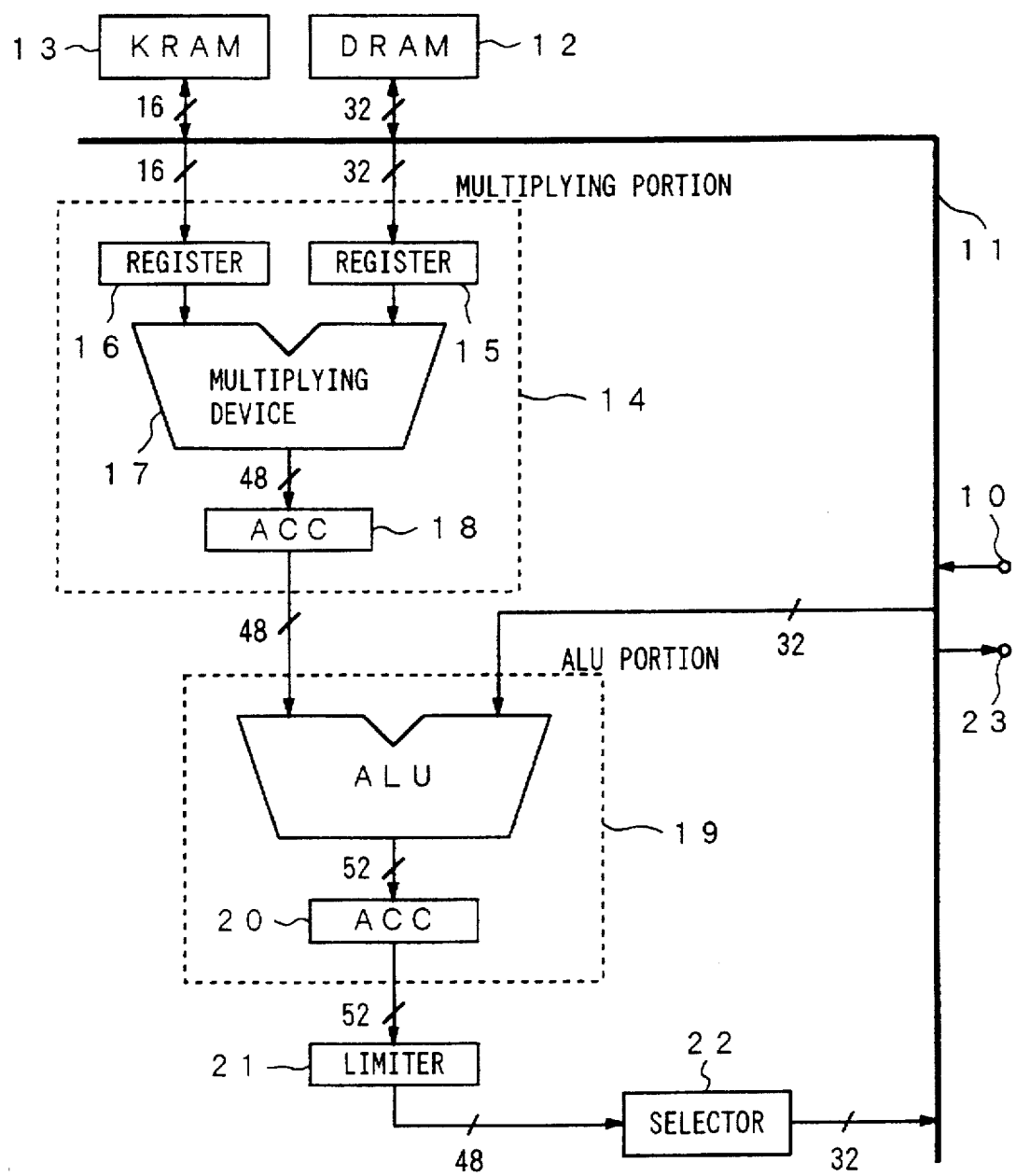
FIG. 6 is a block diagram showing an example of the circuit structure of the IIR type digital filter according to the related art reference accomplished by the real hardware.

The flow of steps up to step S46 of FIGS. 2A and 2B is completely the same as the flow of steps up to step S46 of the related art reference of FIGS. 5A and 5B. In the circuit structure shown in FIG. 3, an adding circuit 3 is disposed between the limiter 21 and the selector 22 of the circuit structure of the related art reference shown in FIG. 6. A dither generating circuit 4 is connected to the adding circuit 3 through a switch circuit 5. The switch circuit 5 is controlled by a CPU (not shown) that controls the entire circuit. In this example, the switch circuit 5 is closed by the process at step S48 of the flow chart shown in FIGS. 2A and 2B.

At step S47, output data Y(n) is obtained from the result of step S46 corresponding to the formula (1). The high order four bits of the output data Y(n) are truncated by the limiter 21. Thus, the word length is changed from 52 bits to 48 bits. At step S48, the resultant data Y(n) of which the word length has been changed to 48 bits is supplied to the adding device 3. In addition to the data Y(n), the output of the dither generating circuit 4 is supplied to the adding device 3 through the switch circuit 5. Thus, the dither output of the dither generating circuit 4 is added to the data Y(n). In this example, since the word length of the data Y(n) is changed to 32 bits by the selector 22, the dither is added to for example the bit 33.

At step S48, the data Y(n) of which the dither has been added to the bit 33 is sent to the selector 22. The low order 16 bits of the data Y(n) are truncated by the selector 22. Thus, the word length of the data Y(n) is changed to 32 bits. At step S50, the resultant data is sent to the DRAM 12 and stored therein through the bus 11. In addition, at step S50, the resultant data is sent to the output terminal 23 through the bus 11. The data Y(n) stored in the DRAM 12 is used as output data Y'(n−1) that is one sample earlier than Y(n) as with Y(n−1) at step S41.

After the dither is added to the data Y'(n−1), the low order bits thereof are truncated and then the resultant data is stored in the DRAM 12. Thus, as described above, since the correlation of the truncated data is eliminated, the DC limit cycle due to the circulation of the data can be suppressed.

Having described a specific preferred embodiment of the present invention with reference to the accompanying drawings, it is to be understood that the invention is not limited to that precise embodiment, and that various changes and modifications may be effected therein by one skilled in the art without departing from the scope or the spirit of the invention as defined in the appended claims.

What is claimed is:

1. An IIR type digital filter, comprising:
    an input terminal for receiving an input signal containing input data;
    a plurality of first delay devices connected to said input terminal;
    a plurality of first multiplication devices connected to a respective connection node of said plurality of first delay devices;
    a first addition device for adding an output from each of said plurality of first multiplication devices;
    an output terminal connected to an output of said first addition device;
    a second addition device connected to said output terminal, said second addition device receiving an added signal from said first addition device;
    a plurality of second delay devices connected to an output of said second addition device;
    a plurality of second multiplication devices connected to a respective connection node of said plurality of second delay devices;
    connecting means for connecting each of said plurality of second multiplication devices to said first addition device such that said plurality of second multiplication devices provides respective feedback signals to said first device by way of said connecting means; and dither generating means connected to said second addition device for generating dither, said dither being added to said added signal from said first addition device by said second addition device to form a dithered added signal, wherein said dithered added signal is supplied to said plurality of second multiplication devices through said plurality of second delay devices such that said feedback signals from said plurality of second multiplication devices are dithered to prevent a DC limit cycle from occurring.

2. The IIR type digital filter as set forth in claim 1, wherein said dither generated by said dither generating means is added to an output bit of said added signal from said first addition device, wherein said output bit occurs after an LSB of a word length of one of said plurality of delay devices connected to said second addition device.

* * * * *